(12) United States Patent
Hoffmann et al.

(10) Patent No.: US 7,160,406 B2
(45) Date of Patent: Jan. 9, 2007

(54) CERAMIC SUBSTRATE AND METHOD FOR THE PRODUCTION THEREOF

(75) Inventors: Christian Hoffmann, Deutschlandsberg (AT); Klaus-Dieter Aichholzer, Deutschlandsberg (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 10/487,301

(22) PCT Filed: Sep. 13, 2002

(86) PCT No.: PCT/DE02/03412

§ 371 (c)(1),
(2), (4) Date: Feb. 20, 2004

(87) PCT Pub. No.: WO03/024711

PCT Pub. Date: Mar. 27, 2003

(65) Prior Publication Data
US 2004/0206546 A1    Oct. 21, 2004

(30) Foreign Application Priority Data
Sep. 14, 2001    (DE)    ................... 101 45 363

(51) Int. Cl.
*B32B 37/04*    (2006.01)
*B32B 37/18*    (2006.01)
*B32B 38/10*    (2006.01)
*C04B 37/00*    (2006.01)
*C04B 35/64*    (2006.01)
*H05K 1/00*    (2006.01)

(52) U.S. Cl. .................. 156/89.12; 156/89.16
(58) Field of Classification Search .......... 156/89.11, 156/89.12, 89.16
See application file for complete search history.

(56) References Cited

U.S. PATENT DOCUMENTS

| 5,102,720 | A | * | 4/1992 | Raj ........................ 428/209 |
| 5,171,645 | A | | 12/1992 | Khandkar |
| 5,207,968 | A | * | 5/1993 | Phelps et al. ............ 264/344 |
| 5,534,331 | A | | 7/1996 | Aoki et al. |
| 5,855,711 | A | * | 1/1999 | Araki et al. ............ 156/89.16 |
| 5,866,245 | A | | 2/1999 | Toriyama et al. |
| 5,876,536 | A | * | 3/1999 | Kumar et al. ........... 156/89.11 |
| 5,925,444 | A | * | 7/1999 | Katsumura et al. ...... 428/209 |
| 6,207,905 | B1 | | 3/2001 | Taga et al. |
| 6,337,123 | B1 | * | 1/2002 | Ryugo et al. ........... 428/210 |
| 6,413,620 | B1 | * | 7/2002 | Kimura et al. .......... 428/210 |
| 6,582,541 | B1 | * | 6/2003 | Nishide et al. .......... 156/89.12 |
| 6,811,635 | B1 | * | 11/2004 | Sakamoto et al. ....... 156/89.16 |
| 2002/0061629 | A1 | * | 5/2002 | Nishide et al. .......... 438/453 |

FOREIGN PATENT DOCUMENTS

DE    691 06 830    8/1995

(Continued)

*Primary Examiner*—Melvin Mayes
(74) *Attorney, Agent, or Firm*—Fish & Richardson P.C.

(57) ABSTRACT

A process for producing a ceramic substrate includes preparing a base body using a stack of layers that contain an unsintered ceramic material and a sintering agent, and sintering the stack of layers. At least one of the layers contains an increased proportion of sintering agent relative to an adjacent layer.

14 Claims, 2 Drawing Sheets

FOREIGN PATENT DOCUMENTS

| | | | |
|---|---|---|---|
| DE | 196 43 148 | | 4/1998 |
| JP | 04369509 | | 12/1992 |
| JP | 5-47960 | * | 2/1993 |
| JP | 05047960 | | 2/1993 |
| JP | 06100377 | | 4/1994 |
| JP | 06112604 | | 4/1994 |
| JP | 2 354 484 | * | 3/2001 |
| JP | 2001-158670 | * | 6/2001 |

* cited by examiner

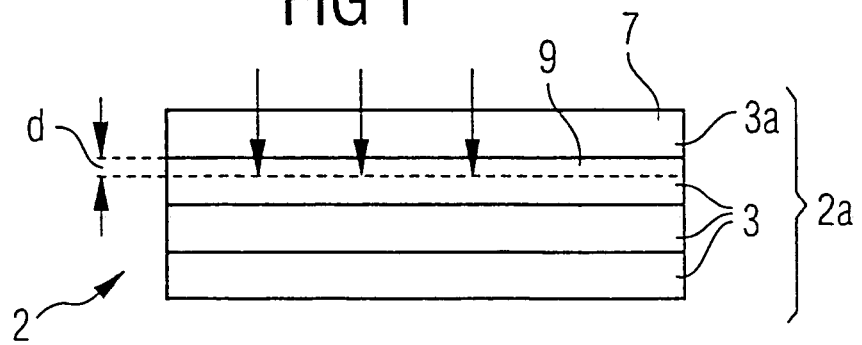
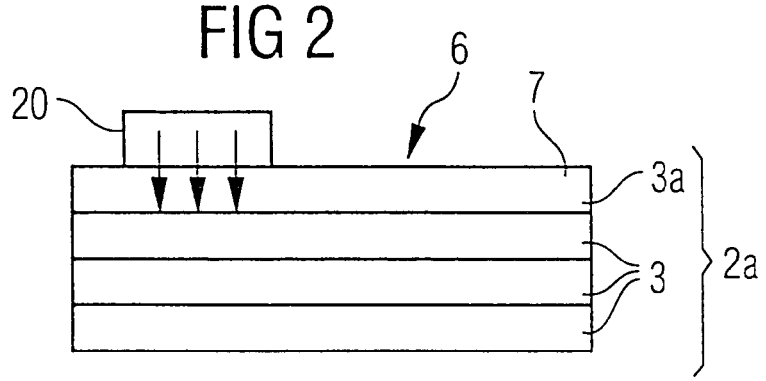
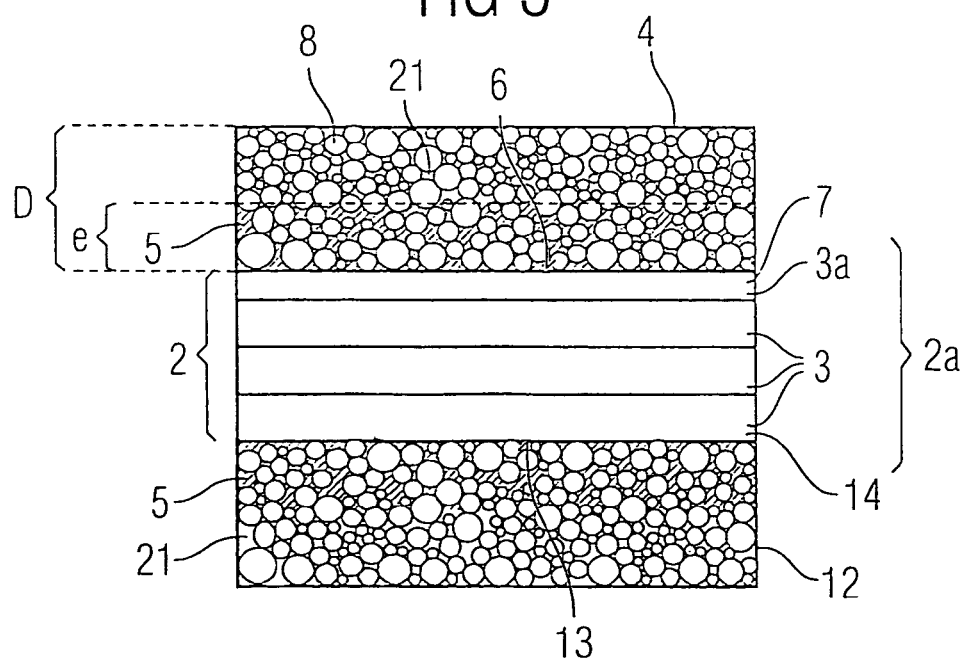

CERAMIC SUBSTRATE AND METHOD FOR THE PRODUCTION THEREOF

TECHNICAL FIELD

The invention relates a process for producing a ceramic substrate, wherein a base body is prepared that has a stack of superimposed layers. The layers in the stack contain an unsintered ceramic material. In a subsequent step, the stack is sintered.

BACKGROUND

Processes of the kind mentioned in the introduction are used in the production of ceramic multi-layer substrates in which passive components can be integrated. Active components can be mounted on the surface of the substrate via binding technologies such as SMD, wire bonding, or flip-chip assembly. In this way, multi-functional modules are formed that are especially suitable for saving space.

A process of the kind mentioned in the introduction is known from printed document U.S. Pat. No. 6,207,905, where the superimposed layers contain a ceramic material and glass. In this case the proportion of glass and ceramic materials is about 50% by weight in each case. The glass serves here as an auxiliary sintering agent and it is created in the known process in such a way that it is recrystallized (reaction sintering). Because of the glass proportion of about 50 wt % in the known process, reaction layers only a few microns thick are formed between the individual layers of the multi-layer structure. In mounting components on the surface of the sintered stack of layers, shearing stresses can lead to a breaking of the top reaction layers, which leads to part of the top layer being torn away from the stack of layers. This problem appears more strongly when the top layer of the stack of layers is covered over its whole surface with an organic material and shearing stresses are applied to this layer.

SUMMARY

The goal of the present invention is therefore to provide a process for producing a ceramic substrate that permits the mechanical binding of the layers in a stack of layers to be improved.

The invention provides a process for producing a ceramic substrate, wherein, in a first step, a base body with a stack of superimposed layers is prepared. The superimposed layers contain an unsintered ceramic material and a sintering agent.

One of the layers of the stack of layers has in increased proportion of the sintering agent than a layer adjacent to it.

In a subsequent step, the stack of layers is sintered, whereby a monolithic sintered body is formed that represents at least an essential component of the ceramic substrate to be produced.

The process according to the invention has the advantage that through the increased proportion of the sintering agent in one of the layers, the exchange of sintering agent between the layers of the stack of layers is increased. The reason for this is the concentration gradient of the sintering agent between the layers of the stack of layers. The exchange of sintering agent between the layers of the stack of layers can take place by diffusion, whereby the diffusion is driven by the difference in the concentration of sintering agent between the layers. The increased exchange of sintering agent between the layers of the stack of layers leads to an improved binding between the layer that has the increased proportion of sintering agent and a layer adjacent to it.

In an advantageous embodiment of the invention, a sintering agent is used that is present after the sintering in another chemical composition than it had before the sintering. Such sintering agents are, for example, sintering agents that are suitable for reaction sintering. An example of such a sintering agent is a glass that contains $SiO_2$ and calcium. Such a glass can form a chemical compound called anorthite ($CaAl_2Si_2O_8$) with the ceramic material $Al_2O_3$ at a temperature of 900° C. In addition, it is characteristic of reaction sintering that the sintering agent can flow already at temperatures that are lower than the sintering temperature. In this way, the sintering agent migrates during the sintering and distributes itself within the base body. In particular, the sintering agent can migrate from the layer with an increased proportion of sintering agent to an adjacent layer with lower proportions of the sintering agent.

It is also advantageous if the layer with the increased proportion of sintering agent is the top layer of the stack of layers. For in this case, the binding of the top layer of the stack of layers to the layers below it is improved, whereby the sensitivity of the ceramic substrate produced with the process is reduced with respect to a shearing stress of the ceramic substrate formed, for example, by soldering components onto the surface of the substrate.

The sintering agent or the ceramic material in the layers of the stack of layers can be selected in such a way that a reaction layer is formed between the layer with the increased proportion by weight of sintering agent and the adjacent layer with a lower proportion by weight of sintering agent. Such a reaction layer is formed within the layer with the lower proportion of sintering agent.

In particular, the sintering agent or the increased proportion by weight of sintering agent can be selected in such a way that a reaction layer is formed that has a thickness between 5 and 100 µm. Such a reaction layer between two layers of the stack of layers is significantly thicker than the thickness of the reaction layers formed in the known processes for producing ceramic substrates. The reaction layers produced by the process according to the invention therefore transmit a significantly stronger adhesion between two ceramic layers.

In addition, it is advantageous if a modified unbinding and sintering profile is used in the process according to the invention is used to activate the increased glass proportion. In a modified sintering profile, at a temperature above the softening temperature of the sintering agent, an additional waiting time is added that gives the increased quantity of sintering agent sufficient time to diffuse.

The layer with the increased proportion of sintering agent can contain, for example, between 60 and 90 wt % sintering agent.

In another step in producing the ceramic substrate, a metal paste containing a sintering agent can be applied to the surface of the top layer of the stack of layers and enameled. The enameling of the metal paste can be performed at a temperature above 600° C. Through the increased proportion of sintering agent in the top ceramic layer, a chemical compound is formed during sintering between the ceramic material and the sintering agent that differs from the chemical compound formed when the ceramic proportion and the glass proportion are approximately equal by weight. This differing compound has the property that it is less brittle, because of the increased glass proportion. Such a compound in the top layer of the stack of layers is damaged far less, due to the glass penetrating into this top layer from the metal paste, than a compound of sintering agent and ceramic material that is formed when both components are present in approximately equal proportions by weight. Accordingly, for the case of contact surfaces formed by a metal paste on the surface of the ceramic substrate, the process according to the invention has the advantage that these contact surfaces adhere better to the top layer of the ceramic substrate and cannot be torn away as easily when components are mounted.

Such a metal paste can contain, in addition to glass, 70–90 wt % metal, as well as appropriate binders and solvents.

In another advantageous embodiment of the invention, before the sintering, a forcing layer is arranged on the top layer of the stack of layers, which is attached to the stack of layers through the penetration of the sintering agent from the top layer of the stack of layers into the forcing layer during the sintering. After the sintering, the forcing layer is removed again. The forcing layer can be removed, for example, by scraping or scattering.

Providing a forcing layer during the sintering of the stack of layers has the advantage that shrinkage of the stack layers in the direction lateral to the layers that form the stack of layers can be reduced. The forcing layer assures that the stack of layers shrinks only very little in a lateral direction.

As the forcing layer, a stiff forcing layer in the form of a sintered $Al_2O_3$ plate or even a flexible forcing layer in the form of a green tape can be considered that contains no sintering agent and consequently is not sintered during the sintering of the stack of layers. Such a flexible forcing layer is known, for example, from printed document DE 691 06 830 T2.

Through an increased proportion of sintering agent in the top layer of the stack of layers, it is possible for the sintering agent to penetrate into the forcing layer over a depth >50 µm. The penetration depth of the sintering agent into the forced layer would accordingly be greater than 50 µm. The shrinkage-blocking effect in the case of a flexible forcing layer is based essentially on placing an unsintered, dense powder layer on the upper side of the stack of layers. Depending on the depth of penetration of the sintering agent into the forcing layer, the forcing layer must be thick enough that at least part of the forcing layer (a thickness of about 100 µm) does not come into contact with the sintering agent and is accordingly not sintered. Only by not sintering part of the forcing layer can shrinkage of the stack of layers during the sintering be avoided.

The forcing layer can have a thickness >150 µm, for example, in the case of a flexible forcing layer.

The top layer of the stack of layers can contain a sintering agent that can flow during the sintering. In this way, the forcing layer can be attached to the top layer during the sintering.

In an advantageous embodiment of the invention, the forcing layer can have pores into which the sintering agent penetrated during the sintering. Since the sintering agent can flow during sintering, it can penetrate into the pores of the forcing layer. Suitable pores in the forcing layer would have a size of 50 to 10 µm, where a suitable pore size also depends on viscosity of the sintering agent during the sintering. In an embodiment of the invention, glass is used as a sintering agent that contains $SiO_2$ and calcium.

The chemical reaction between the sintering agent and the forcing layer can take place, for example, by sintering (reaction sintering). In particular, a flexible forcing layer can be used that is known from the reference mentioned. In particular, a flexible forcing layer can be applied to the upper side of the stack of layers in the form of a ceramic green tape, where the green tape is free of sintering agent. In this way, it is assured that at least part of the forcing layer is not sintered during the sintering of the stack of layers.

A flexible forcing layer can be, for example, a green tape that contains $Al_2O_3$ grains and a polymeric binder.

In another advantageous embodiment of the invention, the forcing layer and the sintering agent are selected in such a way that the sintering agent reacts chemically with components of the forcing layer during the sintering.

For such a chemical reaction, a ceramic plate containing $Al_2O_3$ can be used, for example, as a stiff forcing layer. A glass that contains $SiO_2$ and calcium can be used, for example, as the sintering agent in the top layer of the stack of layers. Such a glass can form a chemical compound called anorthite ($CaAl_2Si_2O_8$) at a temperature of 900° C. with the $Al_2O_3$ in the forcing layer. In this way, a reaction layer is formed between the top layer of the stack of layers and the forcing layer, which achieves a firm binding of the forcing layer to the top layer of the stack of layers.

In particular, a ceramic plate can be used as a stiff forcing layer that contains $Al_2O_3$ and is free of sintering agents. Such a ceramic plate can be produced by sintering at temperatures of 1500° C. This high sintering temperature assures that the forcing layer will no longer be subject to shrinkage during the sintering of the stack of layers at temperatures >1000° C.

It is also advantageous if the penetration of the sintering agent into the pores of the forcing layer and the chemical reaction of the sintering agent with components of the forcing layer are combined together by an appropriate selection of materials. In this way, an especially firm binding of the forcing layer to the top layer of the stack of layers is achieved.

In an advantageous embodiment of the invention, a stiff forcing layer can be used that has a thickness between 0.5 mm and 1.5 mm. The forcing layer in this case must have a certain minimum thickness, in order to have sufficient mechanical stability, especially for sintered bodies with large areas. In addition, however, the forcing layer should not be too thick, since otherwise removal of the forcing layer will be too expensive.

The forcing layer can contain grains of $Al_2O_3$, for example that are sintered together.

The layers of the stack of layers can contain, as ceramic solid components, barium titanate, calcium titanate, strontium titanate, lead titanate, $CaZrO_3$, $BaZrO_3$, $BaSnO_3$, metal carbides such as silicon carbide, metal nitrides such as aluminum nitride, minerals such a molite and cyanite, zirconium dioxide, or also various types of silicon dioxide. Even glasses with a high softening point can be used as the ceramic component, provided that they have sufficiently high softening points. In addition, mixture of materials of these kinds can be used for the ceramic solid component of the layers of the stack of layers.

The use of the process according to the invention to produce ceramic substrates makes it possible, in particular, to used stacks of layers that have the form of a plate, where the plate as a basic area of at least 18 cm×18 cm and a height of 0.5 to 3 mm. By means of such plates, substrate with a large area can be produced in a single production step, or a large number of small substrates can be produced by subsequent cutting of a substrate with a large area into pieces.

It is also especially advantageous if the sintering of the stack of layers is performed at a temperature of less than 1000° C. since, in this case, an LTCC sintering process is available that makes it possible to used silver compounds for conducting structures inside the substrate, which leads to lower losses within the component. The use of silver also has the advantage that is more easily available and less expensive than the platinum required at higher sintering temperatures.

It is also advantageous if, in addition to the upper side of the stack of layers, a forcing layer is also arranged on the lower side of the stack of layers. In this way, shrinkage of the layers of the stack of layers is prevented from two sides, which has the overall consequence of even less shrinkage.

Use of a stack of layers should also be considered in which there are conducting paths between two layers. These conducting paths can be used to produce wiring between active components arranged on the upper surface of the ceramic substrate and passive components inside the ceramic substrate. The conducting paths or electrically conducting areas between two layers of the stack of layers can also be used to make passive components, for example capacitors or coils.

In order for conducting paths arranged between the layers to contact each other, it is advantageous if a layer in the stack contains a hole that is electrically conducting and connects conducting paths on two different sides of the layer and passive components inside the ceramic substrate together.

The invention also provides a ceramic substrate that contains a stack of superimposed layers. The superimposed layers of the stack of layers contain a ceramic material and are sintered together. They also contain residues of a sintering agent that have not been converted into another compound by reaction sintering. One of the layers of the stack of layers contains a higher proportion of residues of a sintering agent than a layer adjacent to this layer. Such a ceramic substance can be produced by the process according to the invention. Through the higher proportion of sintering agent before the sintering, the layer also receives an increased residual proportion of sintering agent. The proportion of unconverted residues of sintering agent can be between 5 and 30 wt %.

Between the layer with the increased proportion of unconverted residues of sintering agent and the adjacent layer, a reaction layer can be arranged, in particular, that contains residues from the layer with the high proportion of unconverted residues of a sintering agent. In addition, the reaction layer contains ceramic material and sintering agent from the adjacent later. The reaction layer can have a thickness between 10 and 50 µm. The reaction layer is thereby significantly thicker than the reaction layers used according to the known process.

In the following, the invention will be explained in more detail with reference to embodiment examples and the attached diagrams.

DESCRIPTION OF THE DRAWINGS

FIG. 1 shows, as an example, a ceramic substrate during its production following the process according to the invention, in a schematic cross-section.

FIG. 2 shows, as an example, a ceramic substrate that is produced by the process according to the invention with a metal paste on the surface.

FIG. 3 shows, as an example, a ceramic substrate during its production following the process according to the invention, in a schematic cross-section.

DETAILED DESCRIPTION

Figure 4:
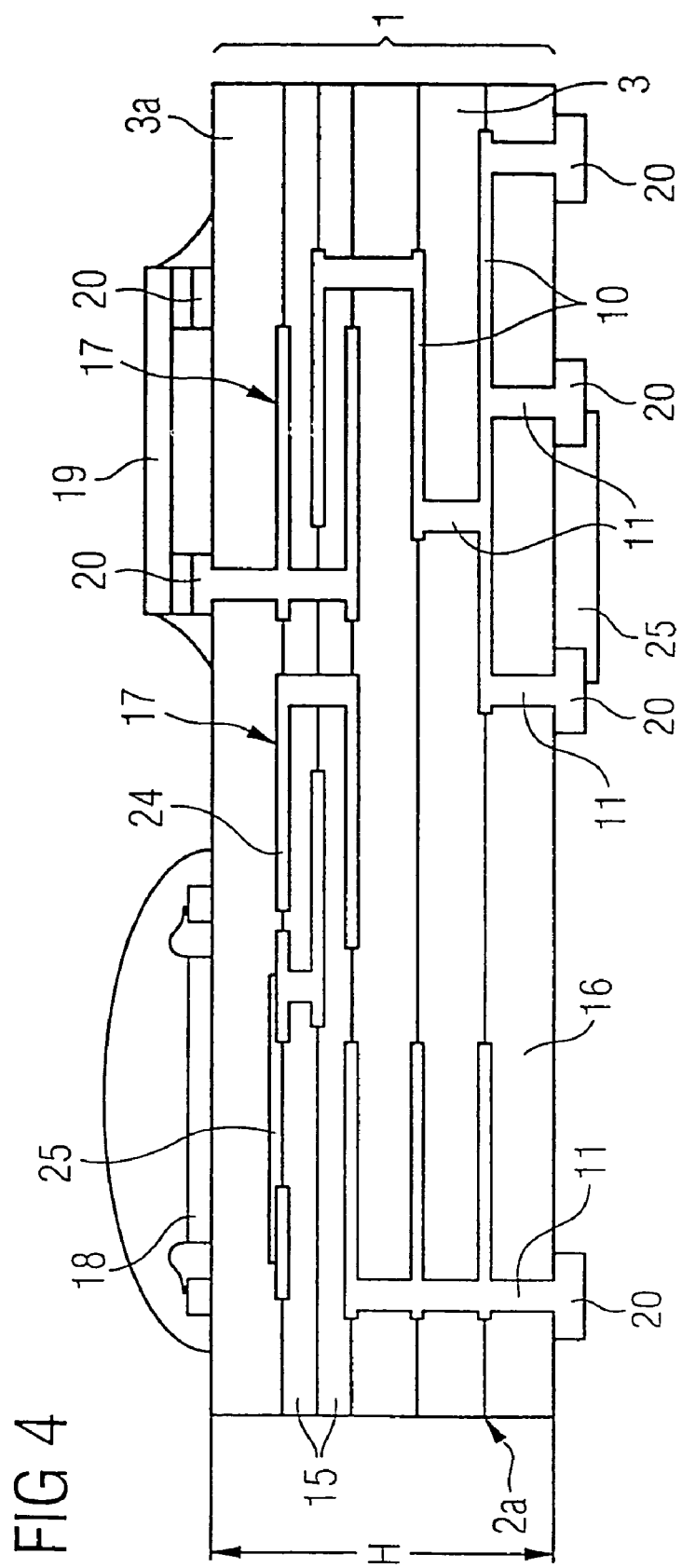
FIG. 4 shows an example of an LTCC substrate produced by the process according to the invention, in a schematic cross-section.

FIG. 1 shows a base body 2 with a stack 2a of superimposed layers 3. The layers 3 contain an unsintered ceramic material. In general, layers 3 of the stack of layers 2a also contain, in addition to the ceramic material and the sintering agent, a binder, which gives the flexibility necessary for processing to the layers 3, which are generally present as green tapes. The binder, which can be a polymeric binder, for example, is removed by burning the binder already before the sintering of the stack of layers. The top layer 7 of the stack of layers 2a is a layer 3a with an increased proportion of sintering agent. The sintering agent can diffuse, as indicated by the arrow, from the layer 3a into the layer 3 below it and form a reaction layer 9 there. The thickness, d, of the reaction layer 9 can be 10 to 50 µm, for example. The thickness of the reaction layer 9 can be set by the excess of sintering agent in layer 3a. The thicker the reaction layer 9 is, the better the mechanical binding is between the top layer 7 of the stack of layers 2a to the layer 3 below it.

FIG. 2 shows a stack of layers 2a with superimposed layers 3, whereby the top layer 7 of the stack of layers 2a is a layer in an increased proportion of sintering agent. For FIGS. 1 and 2, the proportion by weight of sintering agent in layer 3a is 70%. In addition, layer 3a also contains $Al_2O_3$ as a ceramic material. A metal paste 20 is applied onto the surface 6 of the top layer 7, with the aid of which a contact area is to be realized on the upper side of the stack of layers 2a. The metal paste 20 contains a metal powder and a proportion of glass. The glass proportion in this case can be the same sintering agent as used in the layers 3 of the stack of layers 2a, in particular it can also contain the same sintering agent as used in layer 3a with an increased proportion of sintering agent. But for the individual layers 3 of the stack of layers 2a or even only for layer 3a with an increased proportion of sintering agent, different sintering agents can be used, for example, glasses that melt at different temperatures.

The metal paste 20 is enameled onto the surface 6 of the top layer 7. During the enameling, part of the glass proportion of the metal paste 20, about 2 wt %, diffuses into the top layer 7 of the stack of layers (cf. the arrow). A glass with a proportion of calcium can be used as the sintering agent in both FIGS. 1 and 2. Because of the increased glass proportion of layer 3a in the stack of layers 2a, the glass penetrating from the metal paste 20 into the top layer 7 still has only a slight effect so that only a very low change in the chemical composition of the sintered layer 3a occurs. The result is increased strength of the binding of the metal paste 20 to the top layer 7 of the stack of layers 2a. In this way, the mechanical strength is increased and the danger of metal surfaces on the upper side of the stack of layers being torn away during the soldering of components is thereby reduced.

FIG. 3 shows a base body 2 with a stack 2a of superimposed layers 3. Layers 3 contain an unsintered ceramic material. In general, layers 3 of the stack of layers 2a contain, in addition to the ceramic material and sintering agent 5, also a binder, generally present as green tapes, that gives the flexibility necessary for processing. The surface 13 of bottom layer 14 of the stack 2a lies directly on the second stiff forcing layer 12. The forcing layer 4 lies directly on the surface 6 of the top layer 7 of the stack 2a. The top layer 7 of the stack is a layer 3a with an increased proportion of sintering agent. The forcing layers 4, 12 contain grains 8 of $Al_2O_3$ and have pores 21. These pores 21 form hollow spaces into which the sintering agent 5 deriving from the top layer 7 or from the bottom layer 14 of the stack of layers 2a, can penetrate. Through the sintering agent 5 penetrating into the pores 21, an adhesion of the each forcing layer 4, 12 is transmitted to the stack of layers 2a. The forcing layers 4, 12 can be applied to the stack of layers 2a either before or after the unbinding of the stack of layers 2a. Shrinkage can thus be prevented during the sintering process in the longitudinal direction of the layers 3 in the lateral direction of the stack 2a. The strength of the stack of layers 2a in the lateral direction has the effect that shrinkage occurs almost exclusive in the vertical direction, thus perpendicular to the flat sides of the layers 3. This so-called "shrinkage in the z direction" is even stronger in this case.

In this case, the sintering agent 5 penetrates into the forcing layer 4 to a penetration depth, e. Care must be taken that the sintering agent 5 does not penetrate through the entire thickness, D, of the forcing layer 4, but only through a part of it. In the case of a flexible forcing layer, for example, this is especially important. The penetration depth, e, can be significantly greater than 50 µm in this case. Correspondingly, the thickness, D, of the forcing layer 4 must be greater than the penetration depth, e, of the sintering agent 5 into the pores 21 of the forcing layer 4.

A flexible forcing layer 12 can also be applied similarly to the lower surface 13 of the bottom layer 4. The bottom layer 14 of the stack of layers 2a can also be a layer with an increased proportion of sintering agent 5, in which case, corresponding to the type and manner described above, care must be taken here as well in regard to the penetration of the sintering agent 5 into the pores 21 of the forcing layer 12.

FIG. 4 shows a finished ceramic substrate 1 produced by the process according to the invention, from which the forcing layers have already been removed. The substrate 1 is produced from a stack 2a of superimposed layers 3, which contain an unsintered ceramic material, whereby the unsintered ceramic material is converted by sintering into a sintered ceramic material. On the upper side of the top layer 3a of the ceramic substrate 1, components 18, 19 are arranged, whereby the first component 18 is attached to the surface of the ceramic substrate 1 by wire bonding and subsequent and molding and the second component 19 by fillip-chip mounting. The two components 18, 19 can be ceramic microwave filters, for example. On the lower side of the ceramic substrate 1, metal plating is applied from metal paste 20, to which the substrate 1 is soldered onto a circuit board and can thereby be brought into electric contact with other electronic components. Metal plating from metal paste 20 is also applied to the upper side of the substrate 1, to which the components 18, 19 can be attached. The substrate 1 has a height, H, of 1 mm. The number of layers 3 is six.

Inside the substrate 1 there are wiring planes that are realized through conducting paths 10. In this case, there is always a wiring plane at the boundary surface between two layers 3. Conducting paths 10 can be formed, for example, from a screen-pressed silver paste. In addition, a layer 3 also has perforations 11 that contact each other by conducting paths 10 lying on two opposite sides of the layer 3. Electrically conducting materials are arranged in the perforations 11 that advantageously fill the perforations 11 up.

In the upper region of the substrate 1, two of the layers 3 are formed as layers 15 with high $\epsilon$. Such an $\epsilon$ can be, for example, $\epsilon=20$. Through appropriately shaped conducting paths 10 or electrically conducting areas 24 in the wiring planes, passive components such as capacitors 17 can be integrated into the substrate 1. According to FIG. 4, electrically conducting areas 24 are arranged on the boundary layers between two layers 3 and connected to each other through perforations 11 in such a way that meshing comb structures are formed, as are known from multilayer capacitors. By pressing a resistance paste 25 before the bundling of the layers 3 onto the boundary areas between the layers 3, integrated resistances can also be formed as passive components in the substrate 1. By constructing conducting paths 10 in the form of spiral-shaped paths and arranging stackd spiral-shaped paths on one top of another, integrated coils 16 can also be produced in the substrate 1.

The invention presented is used advantageously for stacks 2a that run essentially along planes produced in the layers 3. However, it is also conceivable that bent substrates will be used, in which case the layers 3 cannot run along a plane, but along bent curves.

The invention claimed is:

1. A process for producing a ceramic substrate, comprising:
   preparing a base body using a stack of layers comprised of an unsintered ceramic material and a sintering agent, at least one of the layers containing an increased proportion of sintering agent relative to an adjacent layer; and
   before sintering, arranging a forcing layer on a top layer of the stack, the forcing layer being attached to the stack by the sintering agent penetrating through the top layer into the forcing layer during sintering, wherein the sintering agent penetrates greater than 50 µm into the forcing layer;
   sintering the stack of layers; and
   removing the forcing layer.

2. The process according to claim 1, wherein the sintering agent has a different chemical composition after sintering.

3. The process according to claim 1, wherein a top layer of the stack contains a higher proportion of sintering agent than the adjacent layer.

4. The process according to claim 3, further comprising:
   forming a reaction layer in the adjacent layer between the top layer with the increased proportion of sintering agent and a remainder of the adjacent layer.

5. The process according to claim 4, wherein a thickness of the reaction layer is between 5 µm and 100 µm.

6. The process according to claim 1, wherein an unbinding and sintering profile is used to activate the increased proportion of sintering agent.

7. The process according to claim 1, wherein a proportion of sintering agent in a layer containing the increased proportion of sintering agent is between 60 and 90 wt %.

8. The process according to claim 1, further comprising:
   after sintering and removing the forcing layer, applying a metal paste containing a sintering agent to a surface of a top layer of the stack; and
   enameling the metal paste.

9. The process according to claim 1, wherein the forcing layer has a thickness that is at least 100 µm greater than an amount by which the sintering agent penetrates into the forcing layer.

10. The process according to claim 1, wherein the sintering agent comprises glass.

11. The process according to claim 1, wherein layers that comprise $Al_2O_3$ as ceramic material and glass as the sintering agent are used to form the stack.

12. The process according to claim 1, wherein the stack is plate-shaped and has an area of at least 18 cm×18 cm and a height of 0.5 to 3 mm.

13. The process according to claim 1, wherein the stack has conducting paths arranged between layers.

14. The process according to claim 1, further comprising:
   a forcing layer on a surface of a bottom layer of the stack.

* * * * *